US005589795A

United States Patent [19]

Latva-Aho

[11] Patent Number: 5,589,795
[45] Date of Patent: Dec. 31, 1996

[54] METHOD AND ARRANGEMENT FOR CONTROLLING A LOOP FILTER

[75] Inventor: Matti Latva-Aho, Oulu, Finland

[73] Assignee: Nokia Mobile Phones Ltd., Salo, Finland

[21] Appl. No.: 359,049

[22] Filed: Dec. 19, 1994

[30] Foreign Application Priority Data

Dec. 23, 1993 [FI] Finland .................................. 935837

[51] Int. Cl.$^6$ ...................................................... H03K 5/00
[52] U.S. Cl. ............................ 327/553; 327/551; 327/552; 327/155; 327/156; 327/146; 327/336; 327/558; 331/17
[58] Field of Search ................................... 327/551, 553, 327/336, 345, 147, 148, 150, 155, 156, 157, 159, 552, 554, 558; 331/17

[56] References Cited

U.S. PATENT DOCUMENTS

| | | | |
|---|---|---|---|
| 3,363,194 | 1/1968 | Hileman | 331/17 |
| 4,077,015 | 2/1978 | Carson et al. | 331/4 |
| 4,308,618 | 12/1981 | Levy et al. | 327/552 |
| 4,482,869 | 11/1984 | Hirata | 331/4 |
| 4,562,437 | 12/1985 | Sasaki et al. | 343/394 |
| 4,797,635 | 1/1989 | Hatcher | 331/17 |
| 4,904,958 | 2/1990 | Wyatt | 331/17 |
| 5,047,733 | 9/1991 | Nonaka et al. | 331/14 |
| 5,227,748 | 7/1993 | Sroka | 333/207 |
| 5,267,234 | 11/1993 | Harrison | 370/38 |
| 5,268,655 | 12/1993 | Dong | 331/16 |
| 5,309,418 | 5/1994 | Suzuki | 364/44 |
| 5,396,657 | 3/1995 | Jokinen | 455/307 |

FOREIGN PATENT DOCUMENTS

| | | |
|---|---|---|
| 0044154 | 1/1982 | European Pat. Off. . |
| 0153868 | 5/1987 | European Pat. Off. . |
| 0332467 | 9/1989 | European Pat. Off. . |
| 0414260 | 2/1991 | European Pat. Off. . |
| 0563945 | 10/1993 | European Pat. Off. . |
| 0571853 | 12/1993 | European Pat. Off. . |
| 56-117429 | 9/1981 | Japan . |

OTHER PUBLICATIONS

Patent Abstract JP 3-26020, Application No. 64-159589, NEC Corporation.
"Phase Locked Loop Circuit" Feb. 4, 1991, Susumu Otani.
Finnish Office Action For Priority Finnish Patent Application 935837 and English translation thereof dated Aug. 24, 1994.
"Stable and fast PLL switches loop bandwidths", Yekutiel Josefsberg, Electronics Mar. 10, 1982, p. 139.
"A Survey of Digital Phase–Locked Loops" W. Lindsey et al., Extract IEEE 1981, vol. 69 No. 4, pp. 410–431.

*Primary Examiner*—Timothy P. Callahan
*Assistant Examiner*—Dinh T. Le
*Attorney, Agent, or Firm*—Perman & Green

[57] ABSTRACT

The invention relates to a method and an arrangement for controlling a loop filter of a digital phase lock, the loop filter filtering a difference signal, which comes from a phase comparator at a predetermined bandwidth and is proportional to a phase error. To reduce oscillation in the adjusting method and to eliminate the errors caused by noise, the loop filter is adjusted non-linearly on the basis of the difference signal from the phase comparator in such a manner that the bandwidth of the loop filter changes.

6 Claims, 3 Drawing Sheets

METHOD AND ARRANGEMENT FOR CONTROLLING A LOOP FILTER

FIELD OF THE INVENTION

The invention relates to a method for controlling a loop filter of a digital phase lock circuit. In particular the loop filter limits a difference signal, which comes from a phase comparator to a predetermined bandwidth that is proportional to a phase error.

BACKGROUND OF THE INVENTION

The object of a phase locking circuit is to lock onto the phase of an incoming signal. Digital phase locks generally comprise a phase comparator which generates a difference voltage proportional to a phase error, i.e, the phase difference between the phase of the phase lock circuit and that of the incoming signal. The difference voltage is filtered by a loop filter to eliminate noise. Signals are received from the output of the loop filter for controlling a clock so that the phase of the clock signal is advanced or retarded. In standard step correctors, the clock phase is corrected in standard steps upward or downward. A phase lock operating on this advance/retard principle is called lead/lag phase lock.

Digital phase locks operating on lead/lag principle use digital filters of a type known as sequential filters, as their loop filters.

FIG. 1 shows schematically the structure of a digital phase lock operating on the lead/lag principle. The phase lock comprises a phase comparator 10, a loop filter 11, a clock 12, a local oscillator 14 and a divider 13. Lead or lag pulses are generated in the phase comparator 10 according to whether the phase of The local oscillator is ahead or behind compared with an incoming signal to the comparator 10. Errors caused by noise can be eliminated from a phase correction signal by means of the loop filter 11. An output signal of the filter controls a clock signal of the phase-locked loop in such a way that its phase is advanced or retarded by removing or adding samples, respectively.

FIG. 2a illustrates the structure of a conventional loop filter of a lead/lag phase lock. The filter comprises three counters 20, 21, 22 and two OR gates 23, 24. Lead and lag pulses are counted in the filter by separate N counters 20 and 21. In addition to this, both pulses are brought via the OR gate 23 to a common M counter 22. If one of the N counters 20, 21 fills up before the common M counter 22, a lead pulse 25 or a lag pulse 26, respectively, is sent from the filter, depending on which one of the counters filled up. After the pulse has been sent, all counters are set to zero by means of a signal 27. On the other hand, if the common M counter 22 fills up at first, all counters are set to zero by the signal 27 and no correction is made. The lengths of the counters are selected in such a way that N<M<2N. The bandwidth and correction rate of the filter can thus be influenced by the values of the numbers N and M. An advantage of this filter is good attenuation in loop operation, but a drawback is slow correction.

Another conventional manner of filtering a phase correction signal is presented in FIG. 2b. The filter in question is a conventional digital infinite impulse Response (IIR) filter comprising two amplifiers 30, 31, a summer 32 and a delay element 33, followed by a threshold detector 34. The integration time of the filter is selected by the amplification parameters a, b of amplifiers 30 and 31 in the filter. The threshold detector K operates as follows:

if input signal of detector $\geq$ threshold, output is +1 if absolute value of input signal of detector < threshold, output is 0 if input signal of detector $\geq$ threshold, output is −1.

Accordingly, both lead and lag pulses are filtered by the same filter, and there are no separate counters. The correction rate of the filter according to FIG. 2b is relatively good, but is a problem slowly attenuating oscillation in the correction process of the loop is a problem.

The capacity of a spread spectrum receiver is substantially influenced by the phase accuracy of the spreading code. An error of 0.5 chips, for instance, causes a power loss of 6 dB. Phase tracking accuracy and especially variance therein are affected, except for a code tracking algorithm, by the quality of the loop filter. It has been noticed that, in practice the code tracking algorithm operating on the lead/lag principle functions well in receivers. However, the loop filters used therein have drawbacks, and an aim of this invention is to improve such loop filters.

When conventional loop filters are used, the variance in phase error increases rapidly and instantaneous error caused by noise therefore is big. When a phase step response exceeding a given threshold is also involved, correction of a phase error may be uncontrolled, with the loop being thrown into a continuous correction state. This situation can be corrected by lengthening the integration time of the filter. However, the integration time cannot be lengthened endlessly. Due to the Doppler effect, the receiver is then no longer capable of tracking the variance in a received signal.

FIG. 3a shows an output signal (I) of an integrator of a traditional loop filter as a function of time in a situation when a clock periods deviates by two samples from the correct value. In FIG. 3b, respectively, a signal is at the output of a threshold detector of the loop filter. In the conventional loop filter, exceeding the threshold affects the output signal of the integrator, so that the phase is corrected by one sample too much. Then the loop receives a control signal of opposite sign and the integrator integrates in the opposite direction until the threshold is exceeded. When a negative threshold is exceeded, a negative clock control pulse is generated. Such a to-and-fro oscillation may last for a long time, even in the presence of noise.

SUMMARY OF THE INVENTION

In a first aspect of the present invention there is provided a method for controlling a loop filter of a digital phase lock circuit, wherein the loop filter filters a difference signal from a phase comparator having a predetermined bandwidth proportional to a phase error. The loop filter is non-linearly adjusted on the basis of the difference signal from the phase comparator in such a manner that the bandwidth of the loop fitter changes.

In a second aspect of the present invention there is provided apparatus for controlling a loop filter of a digital phase lock. The phase lock comprises a phase comparator, a loop filter, a clock, a local oscillator and a divider, characterized in that the loop filter comprises e first integrator, having an input coupled to a signal indicative of a phase difference, a first threshold detector, operatively connected to an output of the first integrator and its output being coupled to the clock, and a second integrator having an input coupled to the signal indicative of a phase difference through a first means for providing an absolute value, a second threshold detector operatively coupled To an output of the second integrator and an OR gate, the inputs of which are the output of the second threshold detector and the output of the first threshold detector through a second means for providing absolute value and the output of which is coupled to one of the inputs of the integrators and which signal deducts a predetermined value from the content of the integrator.

In a third aspect of the present invention there is provided an apparatus for controlling a loop filter of a digital phase lock circuit. The phase lock comprises a phase comparator, a loop filter, a clock, a local oscillator and a divider. The loop filter comprises an integrator having an input coupled to a signal indicative of a phase difference, a threshold detector operatively coupled to an output of the first integrator and its output being coupled to the clock and an output of The detector being coupled to a second input of the integrator which signal deducts a predetermined value from the content of the integrator.

An advantage of the present invention is that there is provided a loop filter by means of which the drawbacks of the previous filters can be ameliorated. In embodiments in accordance with the invention, oscillation in an adjusting process can be reduced and erroneous corrections caused by noise decreased. Additionally, the implementation of a filter in accordance with the invention is simple.

Another advantage of embodiments in accordance with the invention is that the capacity of the loop is improved, particularly for low signal-to-noise ratios, where erroneous corrections are particularly troublesome in conventional methods. For high-level phase difference signals, the integration time of the filter becomes longer on account of the non-linear control of the filter. By means of a loop filter in accordance with the invention, phase step response of the phase lock exceeding a second order threshold can be reduced considerably without the operation of the loop being deteriorated.

BRIEF DESCRIPTION OF THE DRAWINGS

In the following, the invention will be described in greater detail, by way of example only, and with reference to the attached drawings, in which.

DETAILED DESCRIPTION OF THE EMBODIMENTS OF THE INVENTION

Figure 1:
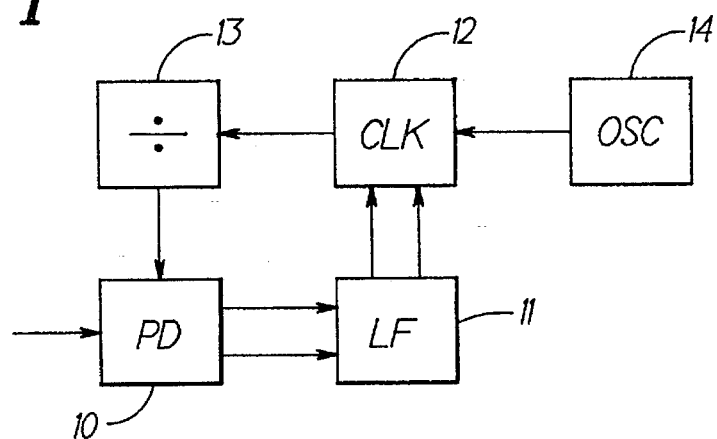
FIG. 1 shows a digital phase lock structure described above.
Figure 2A:
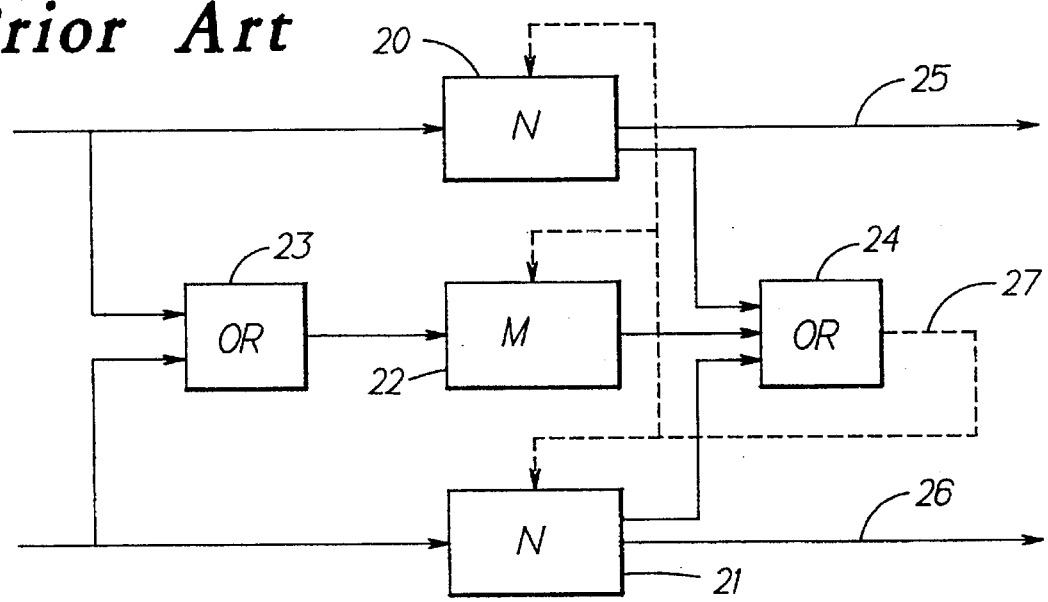
FIGS. 2a and 2b illustrate loop filters according to the prior art described above.
Figure 2B:
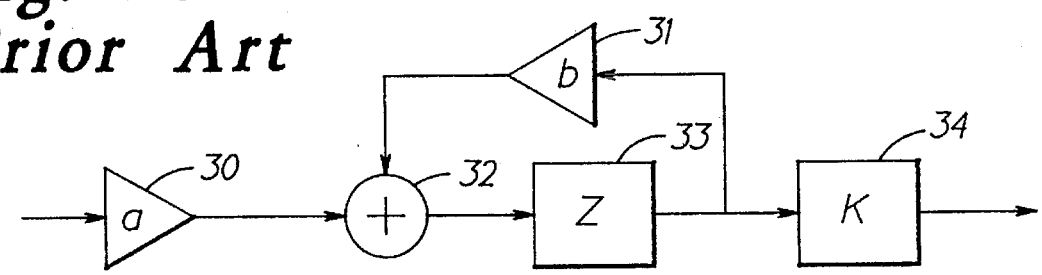
Figure 3A:
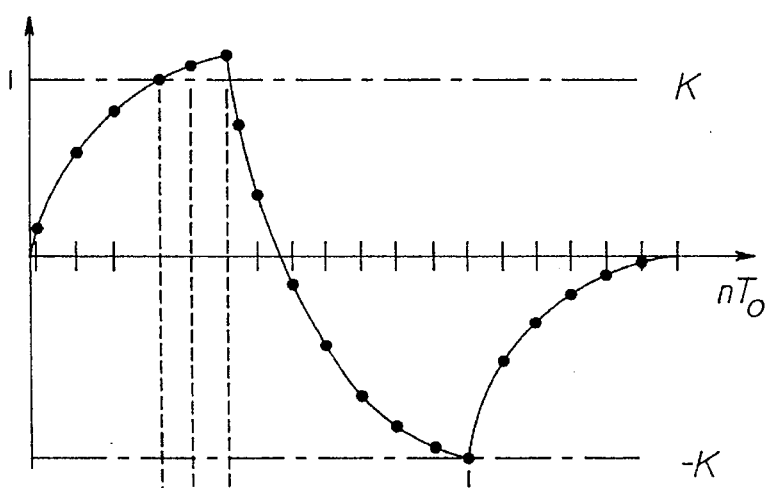
FIGS. 3a and 3b illustrate an example of the operation of a loop filter according to the prior act described above.
Figure 3B:
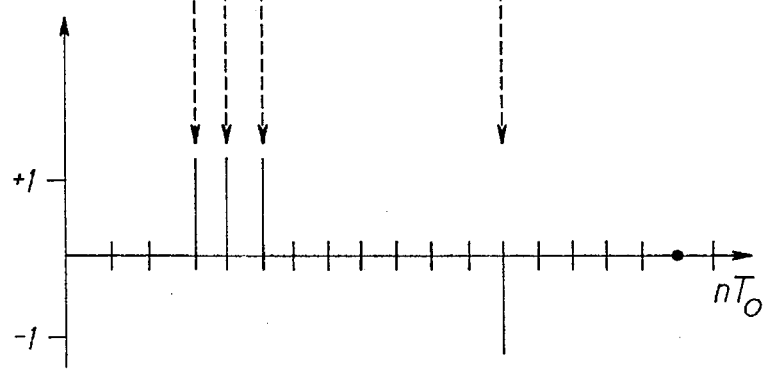
Figure 4A:
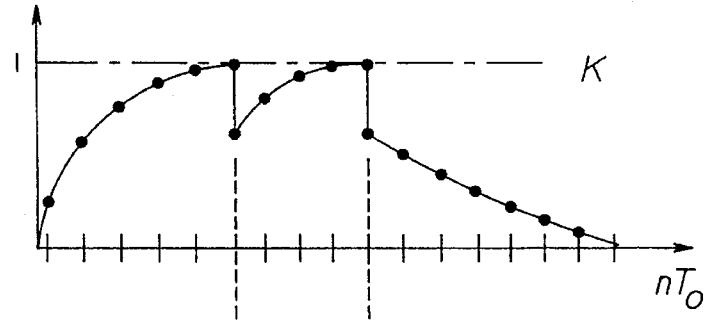
FIG. 4a shows an example of an output signal of an integrator used in a loop filter in accordance with the invention as a function of time.
Figure 4B:
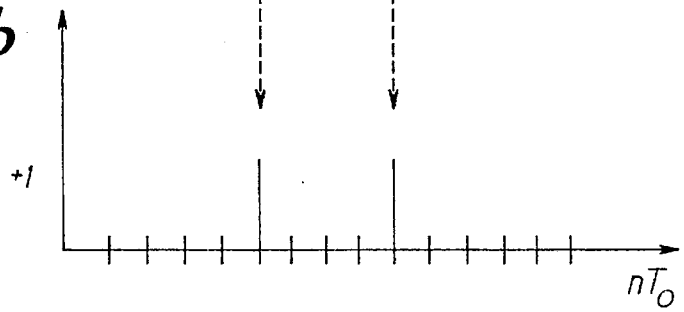
FIG. 4b shows an example of an output signal of a threshold detector used in the loop filter in accordance with the invention as a function of time.

The operation of a loop filter in accordance with the invention is illustrated in FIGS. 4a and 4b. FIG. 4a shows an output signal (I) of an integrator used in the loop filter in accordance with the invention as a function of time in a situation when a clock signal deviates by two samples from the correct value. In FIG. 4b, a signal is at the output of a threshold detector of the loop filter. The signal entering the loop filter increases the signal at the output of the integrator, and when a threshold level K is exceeded (or passed under, on the negative side), a phase correction is performed. In a method in accordance with the invention, a certain predetermined number is deducted from the content of the integrator in connection with a phase correction, causing the output signal of the integrator fall abruptly, in the case shown in FIG. 4, the incoming signal after a first correction pulse increases further the value at tile output of the integrator, and a second correction pulse is generated when the threshold is achieved again. A certain predetermined number is again deducted from the content of the integrator, so that no excessive correction takes place.

By such a non-linear control, the oscillation in the adjusting process can be reduced and noise-induced phase changes can be decreased. The non-linear control performed in response to the signal from the phase comparator causes the bandwidth of the filter to change automatically.

Figure 5A:
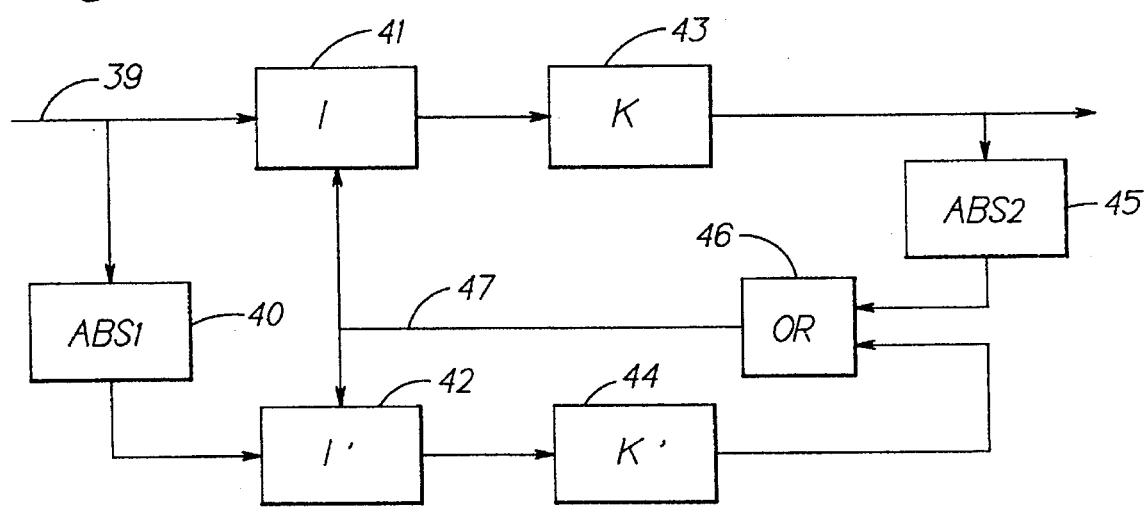
FIGS. 5a and 5b show two possible embodiments of the loop filter implementing the principle in accordance with to the invention.

FIG. 5a shows a block diagram of an example of a digital loop filter implementing a method in accordance with the invention. The filter comprises a first integrator 41, to The input of which is connected a signal 39 coming from the phase comparator. The output of the integrator is connected to the input of a first threshold detector 43, tile output of which threshold detector is coupled to a clock of a phase lock circuit and by which signal the clock is either advanced or retarded. The filter comprises additionally a second integrator 42, to the input of which is connected the signal from the phase comparator through a first rectifier 40 for providing absolute value signals. The output of the second integrator 42 is coupled as an input to a second threshold detector 44. The filter comprises further an OR gate 46, the input Of which consists of the output of the second threshold detector a, 44 and the output of the first threshold detector 43 through a second rectifier 45 for providing absolute value signals. An output signal 47 of The OR gate 46 is connected to the control input of the integrators 41, 42.

The first integrator 41 is used for filtering and detecting a timing error signal. In the case when threshold K is exceeded, the phase of the phase lock is corrected according to the output signal of the threshold detector so as to advance or retard the phase. The second integrator 42 is used for detecting the zero value of the timing error signal, i.e. for preventing spurious corrections caused by noise. When threshold K or K' of the threshold detector 43 or 44 is exceeded, a predetermined constant value is deducted from the content of the integrators 41 and 42 by means of the signal 47 connected to the control input. To make the filter operate in a desired manner, which means that threshold K is exceeded before threshold K', for a desired correction of the phase, the integration times T and T' of the integrators 41 and 42 shall be selected in such a way that T'>T. Proper functioning can also be secured by a suitable selection of the thresholds K and K' of the threshold detectors 43 and 44.

The purpose of the first rectifier 40 for providing an absolute value signal is to change the negative signal values to positive ones and thus to eliminate errors caused by noise. In case the signal contains only noise (which means that no phase error exists), negative and positive signal values are equally probable. The second rectifier 45 for providing absolute value signals is needed the lead and lag signals starting from the threshold detector 43 to be procesed in the same way in the OR gate 46.

Figure 5B:
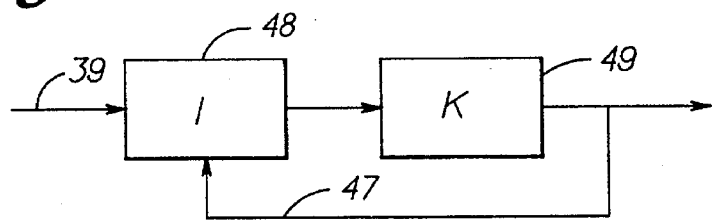

FIG. 5b shows a block diagram of another example of a digital loop filter implementing a method in accordance with the invention. The filter comprises an integrator 48, to the input of which is connected a signal 39 from the phase comparator. The output of the integrator is connected to the input of a threshold detector 49, the output of which is coupled to the clock of the phase lock circuit and by which signal the clock is either advanced or retarded. Additionally, the output of the threshold detector is coupled to a second input of the integrator 48 to provide a constant value to be deducted from the content of the integrator 48. In comparison to the preceding embodiment, the structure and implementation of this filter is simpler and cheaper. As for capacity, however, a filter of this type is, somewhat inferior to the loop filter according to the preceding embodiment.

Figure 6:
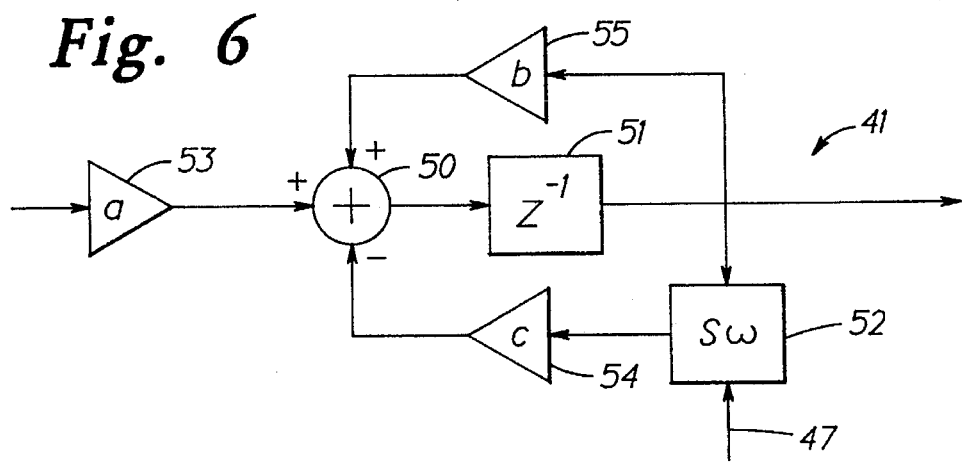
FIG. 6 illustrates the structure of the integrator used in the filter in accordance with the invention.

One possible structure of an integrator to be used in both above-described filters in accordance with the invention is illustrated in FIG. 6. The integrators 41 end 42 mentioned in the previous figure can be implemented by means of an integrator according to the FIG. 6. The integrator comprises an amplifier 53, a delay element 51, a first feedback circuit 55, the input of which is the output of the delay element 51, and a switch 52 the inputs of which are the output of the delay element as well as a signal 47 coming to the control gate of the integrator. The integrator further comprises a second feedback circuit 54 the input of which is the output of the switch 52, and a summer 50, the positive inputs of which are the signal coming to the integrator through the amplifying means 53 and the output of the feedback circuit 55 and the negative input of which is the output of the second feedback circuit 54.

The feedback circuit 55 and the amplifier 53 affect the bandwidth of the integrator in a normal manner. In accordance with a preferred embodiment of the invention, the threshold value K or K' of the loop filter having been exceeded, the signal 47 comes to the control gate of the integrator through an OR gate, under control of which signal a value determined by the feedback circuit 54 is deducted from the output of the integrator.

Though the invention has been described above referring to the examples shown in the attached drawings, it is clear that the invention is not restricted to those, but can be varied in many ways within the scope of the inventive idea set forth in the attached claims. For example, it is possible to implement the loop filter by means of an appropriately conditioned signal processor, operable under software control.

The scope of the present disclosure includes any novel feature or combination of features disclosed Therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. A method of controlling a loop filter in a digital phase lock circuit, said circuit having a phase comparator for outputting a phase signal proportional to phase error, said loop filter having a predetermined bandwidth, said loop filter having an integrator for providing an output signal responsive to said phase signal, said method comprising the steps of:

outputting a phase signal from the phase comparator, the phase signal having a magnitude that is a function of a phase difference between an input signal and a reference signal;

adjusting the output signal of the integrator in a non-linear manner in response to said phase signal that is output from the phase comparator; and changing the bandwidth of the loop filter in response to an internal control resulting from said non-linear adjustment of the output signal of the integrator.

2. The method according to claim 1, wherein an amount of the adjustment of the output signal of the integrator has a predetermined value.

3. The method according to claim 1, wherein level of the output signal of the integrator is decreased when the level of the output signal of the integrator is greater than a predetermined threshold value.

4. Apparatus for controlling a loop filter in a digital phase lock circuit, said phase lock circuit having a phase comparator, a loop filter, a clock, a local oscillator and a divider, said loop filter comprising:

a first integrator in the loop filter, said first integrator having an input coupled to an output of the phase comparator;

a first threshold detector coupled to an output of said first integrator, said first detector having an output coupled to the clock;

a second integrator;

a first means for providing an absolute value, said first means coupling an input of said second integrator to the output of the phase comparator;

a second threshold detector operatively coupled to an output of said second integrator; and an OR gate having a first input connected to the output of said second threshold detector; and a second means for providing an absolute value, said second means connecting a second input of said OR gate to the output of said first threshold detector, an output of said OR gate being connected to inputs of said first and second integrators for controlling said first and second integrators to reduce, when in a predetermined logic state, an output signal of said first and second integrators.

5. The apparatus according to claim 4 wherein each of said first and second integrators further includes:

an amplifier connected to a first input of the integrator, a delay element, first means for providing feedback, said first feedback means having an input connected to an output of said delay element, switching means for selecting either the output of said delay element or a second input of the integrator, second means for providing feedback, said second feedback means having an input connected to the output of said switching means, and a summer having positive inputs connected to said output of said amplifier and to an output of said first feedback means, said summer further having a negative input connected to an output of said second feedback means and having an output connected to an input of said delay element so that said summer deducts a signal value determined by said second feedback means from the content of the integrator under control of a signal supplied to said second input of the integrator.

6. The apparatus according to claim 4, wherein the output signal of said first and second integrators are each reduced by constant amount.

* * * * *